(12) United States Patent
Mairie et al.

(10) Patent No.: US 11,005,258 B2
(45) Date of Patent: May 11, 2021

(54) METHOD FOR DETECTING AND TRANSMITTING DORMANT FAILURE INFORMATION

(71) Applicant: THALES, Courbevoie (FR)

(72) Inventors: Mathieu Mairie, Chatou (FR); Rémy Biaujaud, Chatou (FR); Prithu Mariadassou, Chatou (FR)

(73) Assignee: THALES, Courbevoie (FR)

( * ) Notice: Subject to any disclaimer, the term of this patent is extended or adjusted under 35 U.S.C. 154(b) by 70 days.

(21) Appl. No.: 16/676,198

(22) Filed: Nov. 6, 2019

(65) Prior Publication Data
US 2020/0153237 A1 May 14, 2020

(30) Foreign Application Priority Data

Nov. 8, 2018 (FR) ........................................ 1871452

(51) Int. Cl.
| | |
|---|---|
| *H01F 38/14* | (2006.01) |
| *H02H 7/20* | (2006.01) |
| *H02H 1/00* | (2006.01) |
| *G01R 31/08* | (2020.01) |
| *G01R 23/20* | (2006.01) |
| *G01R 27/26* | (2006.01) |

(52) U.S. Cl.
CPC ............. *H02H 7/20* (2013.01); *H01F 38/14* (2013.01); *H02H 1/0007* (2013.01); *G01R 23/20* (2013.01); *G01R 27/2617* (2013.01); *G01R 31/08* (2013.01); *H02H 1/00* (2013.01)

(58) Field of Classification Search
USPC ........................................................ 361/35
See application file for complete search history.

(56) References Cited

U.S. PATENT DOCUMENTS

| 4,660,014 A | 4/1987 | Wenaas et al. |
|---|---|---|
| 6,870,374 B2 | 3/2005 | Perkins et al. |
| 2005/0225909 A1* | 10/2005 | Yoshizaki .............. H02H 3/042 361/42 |
| 2013/0271166 A1 | 10/2013 | Bouffard et al. |
| 2013/0282312 A1 | 10/2013 | Abeywickrama et al. |

(Continued)

FOREIGN PATENT DOCUMENTS

| CN | 201 007 733 Y | 1/2008 |
|---|---|---|
| CN | 105 699 836 A | 6/2016 |

(Continued)

OTHER PUBLICATIONS

Born, et al., "Marginal checking—a technique to detect incipient failures", Proceedings of the IEEE National Aerospace and Electronics Conference, vol. 4, pp. 1880-1886, May 22, 1989.

(Continued)

*Primary Examiner* — Danny Nguyen
(74) *Attorney, Agent, or Firm* — BakerHostetler

(57) ABSTRACT

An electrical equipment includes a first load configured for a nominal use of the equipment, at least one first metal screen, a sensor configured to measure a quantity characteristic of the first load, and a power supply conductor, wherein the first load and the at least first metal screen are linked electrically to the power supply conductor, and in that the equipment also comprises a comparator configured to compare measurements from the sensor to detect a dormant failure of the at least first metal screen.

7 Claims, 5 Drawing Sheets

(56) References Cited

U.S. PATENT DOCUMENTS

2019/0187006 A1* 6/2019 Abdesselam .......... G01K 3/005
2020/0191852 A1* 6/2020 Handy ............... G01R 31/1272

FOREIGN PATENT DOCUMENTS

EP      0 228 012  A1    7/1987
EP      1 684 395  A2    7/2006

OTHER PUBLICATIONS

Koido, et al., "Preventive maintenance technique for high voltage induction motors", Hitachi Review, vol. 40, No. 2, pp. 151-160, Apr. 1, 1991.

* cited by examiner

METHOD FOR DETECTING AND TRANSMITTING DORMANT FAILURE INFORMATION

CROSS-REFERENCE TO RELATED APPLICATIONS

This application claims priority to foreign French patent application No. FR 1871452, filed on Nov. 8, 2018, the disclosure of which is incorporated by reference in its entirety.

FIELD OF THE INVENTION

The invention relates to a method for detecting and transmitting information on dormant failure of electrical equipment in a critical environment in which a non-detection of a dormant failure, for example failure of the device making it possible to detect a break of insulation in a transformer, can present a risk for the people and the installations.

BACKGROUND

A transformer makes it possible to convert an alternative electrical energy source into magnetic energy and vice versa, the converted energy being of the same frequency as the energy from the initial source. It is composed of primary and secondary windings which have no electrical link between them, only a magnetic coupling. It is powered by one or more alternating voltages, called phases, each via a primary winding which constitutes an input of the transformer. One or more secondary windings make up the outputs of the transformer. A set of primary and secondary windings depending on one and the same input voltage is called coil. There are therefore as many coils as there are phases at the input of the transformer. The transformer makes it possible to exchange energy between the primary windings and the secondary windings without them having to exchange electrons by virtue of the magnetic coupling. The passage through a magnetic medium makes it possible to create a galvanic insulation between the electrical energy passing through the primary winding and the electrical energy passing through the secondary winding, and to raise or lower the amplitudes of the voltages or currents entering into the primary winding and leaving from the second winding through the transformation ratio of the transformer. It can also supply the same voltage or current level between the input and the output of the transformer and simply serve as galvanic insulation.

However, if this galvanic insulation disappears, referred to as a break of insulation, the electrons can circulate from the primary winding to the secondary winding and the transformation ratio of the transformer is no longer guaranteed. Thus, the voltage from the secondary winding can, in the case of a voltage step-down or current step-up transformer, rise above the voltage for which the equipment connected to it is designed and lead to the destruction thereof.

Furthermore, the break of insulation can be sudden and undetectable, and in the current transformers, used for example in aeronautics, it can instantaneously generate a "dreaded failure mode", such as the increase of the voltage in the secondary windings. In order to limit the occurrence of fault of loss of insulation, it is possible to place metal screens, surrounded by thermal insulations, between the primary and secondary windings, the screens being linked to the electrical ground by dedicated wiring. The detection of the break of insulation is then done using, for example, the measurement of a ground leakage current. However, the low point of this solution lies in the grounding of the screens. If the screen/ground link is lost, then the detection is impossible, since this link is not used in the context of a nominal use. In the absence of a dedicated control, the link break between the screen and the ground forms an example of dormant failure.

In order to avoid the loss of link between the ground and the screen, or more generally between a load not used in nominal use and a power supply conductor, it is possible to reinforce the electrical link to avoid the degradation thereof in operation and take particular precautions in production not to inject defects that can lead to a subsequent break. Nevertheless, the loss of link remains undetectable and therefore still constitutes a dormant failure.

SUMMARY OF THE INVENTION

The invention aims to overcome the abovementioned drawbacks and limitations of the prior art. More specifically, it aims to propose a method for detecting and transmitting dormant failure information and electrical equipment capable of detecting a dormant failure, such as, for example, the loss of link between a metal screen and a power supply conductor.

One object of the invention is therefore electrical equipment comprising a first load configured for a nominal use of the equipment, at least one first metal screen, a sensor configured to measure a quantity characteristic of the first load, and a power supply conductor, characterized in that the first load and the at least first metal screen are linked electrically to the power supply conductor, and in that the equipment also comprises a comparator configured to compare measurements from the sensor to detect a dormant failure of the at least first metal screen.

According to particular embodiments of the invention:
  the comparator and the sensor are configured to detect a loss of link between the power supply conductor and the at least first metal screen;
  the at least first metal screen is placed between a primary winding and a secondary winding of an electrical transformer;
  the first load is chosen from among a fan, a contactor and an electronic circuit board;
  the equipment comprises a second metal screen linked in series or in parallel to the at least first metal screen by the power supply conductor; and
  the second metal screen is linked in series to the at least first metal screen and the comparator and the sensor are configured to detect a loss of link between the second metal screen and the at least first metal screen.

Another subject of the invention is a method for detecting the dormant failure and ensuring the safety of equipment according to the invention linked to an electrical power supply system, characterized in that it comprises the following steps:
  a) defining a range of values of a quantity characteristic of the first load guaranteeing the good operation of the equipment;
  b) measuring, with the sensor, the quantity characteristic of the first load;
  c) comparing, with the comparator, the quantities measured in the step b) with the range of values defined in the step a); and d) cutting the link to the electrical power supply system from the equipment if the quantity measured in the step b) is outside of the range defined in the step a).

According to a particular embodiment of the invention, the quantity measured in the step b) is chosen from among a speed, an electrical current, a voltage or a temperature.

BRIEF DESCRIPTION OF THE DRAWINGS

Other features, details and advantages of the invention will emerge from reading the description given with reference to the attached figures given by way of example and which represent, respectively.

DETAILED DESCRIPTION

Figure 1:
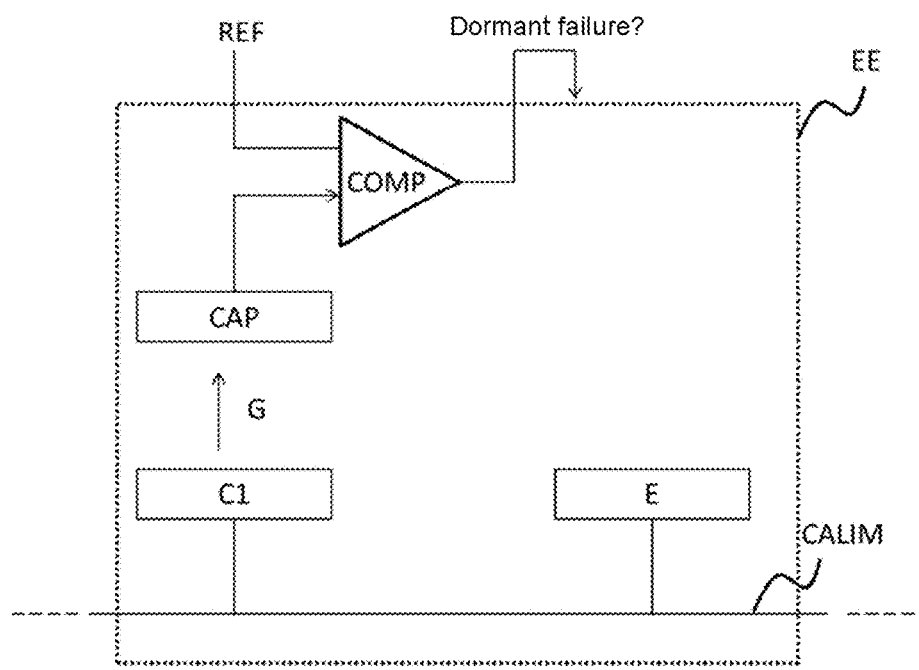
FIG. 1, electrical equipment according to a first embodiment of the invention.

FIG. 1 presents electrical equipment EE according to a first embodiment of the invention. The electrical equipment EE comprises a first load C1 and a metal screen E. The first load C1 is configured for a nominal use of the equipment EE whereas the metal screen E is configured to detect a failure of the equipment EE. The load C1 and the screen E are linked electrically to the same power supply conductor CALIM. The equipment EE also comprises a sensor CAP configured to measure a quantity G characteristic of the first load C1, and a comparator COMP configured to compare measurements of the quantity G characteristic of the first load C1 and measured by the sensor CAP.

According to one embodiment, the comparator COMP can compare the measured values of G with one another over time or compare the values of G with a reference REF. This reference REF can be, for example, a particular value of the quantity G or a range of values of G. The reference REF defines, for example, a value or a range guaranteeing the good operation of the equipment EE. This comparison makes it possible to detect a dormant failure of the equipment EE. For example, the dormant failure can be a failure at the level of the metal screen E, such as a loss of link between the screen E and the power supply conductor CALIM.

According to one embodiment, the electrical equipment EE is an electrical transformer comprising a metal screen E placed between a primary winding and a secondary winding of a coil of the electrical transformer.

According to embodiments of the invention, the comparator COMP is an electrical circuit comprising, for example, an operational amplifier, or the comparator COMP is a computer.

According to embodiments, the first load C1 is an element of the equipment EE, a signal or one of the characteristic quantities of which is permanently monitored in the nominal use of the equipment.

According to embodiments, the sensor CAP is a temperature, or electrical current or voltage or speed sensor.

Figure 2:
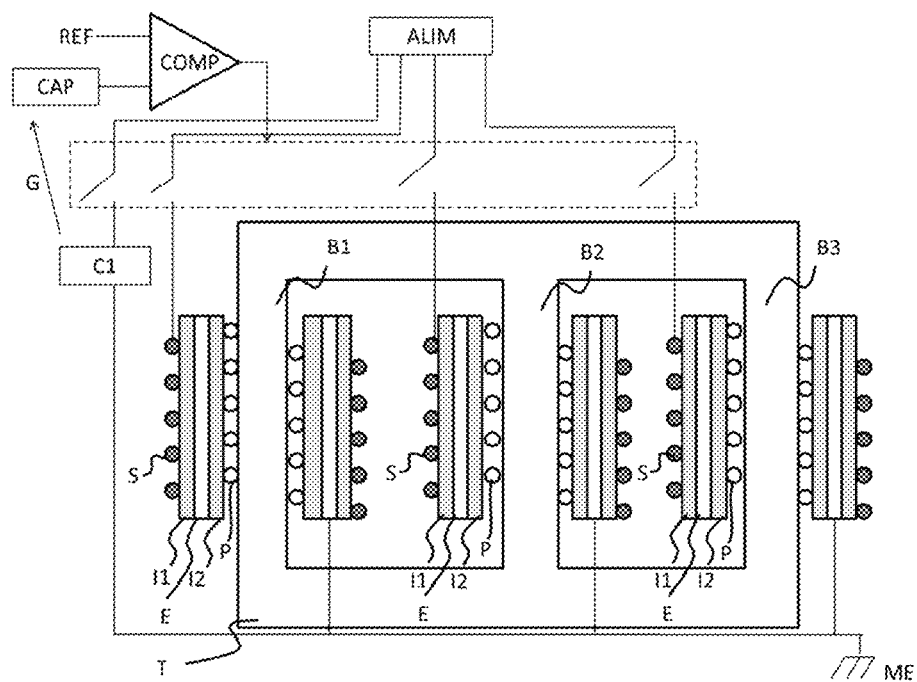
FIG. 2, electrical equipment according to a second embodiment of the invention.

FIG. 2 presents electrical equipment according to a second embodiment of the invention. In this embodiment, the electrical equipment is a transformer T comprising three metal screens E, each placed between a primary winding P and a secondary winding S of three coils (B1, B2, B3). The metal screens E are each surrounded by two layers of thermal insulations I1 et I2. The metal screens E of the different coils B1, B2 and B3 are linked to one another in parallel, and are linked to one and the same power supply conductor, such as, for example, an electrical ground ME. The first load C1 is also linked to this same electrical ground ME. The transformer T is supplied with energy by an electrical power supply system ALIM. A sensor CAP makes it possible to measure a quantity G characteristic of the first load C1. A comparator COMP receives these measurements of G and compares them with one another or with a reference quantity REF. As previously, the reference REF can be a value or a range of values. This comparison makes it possible, in this embodiment, to detect a loss of link between the electrical ground ME and the screens E.

Figure 3:
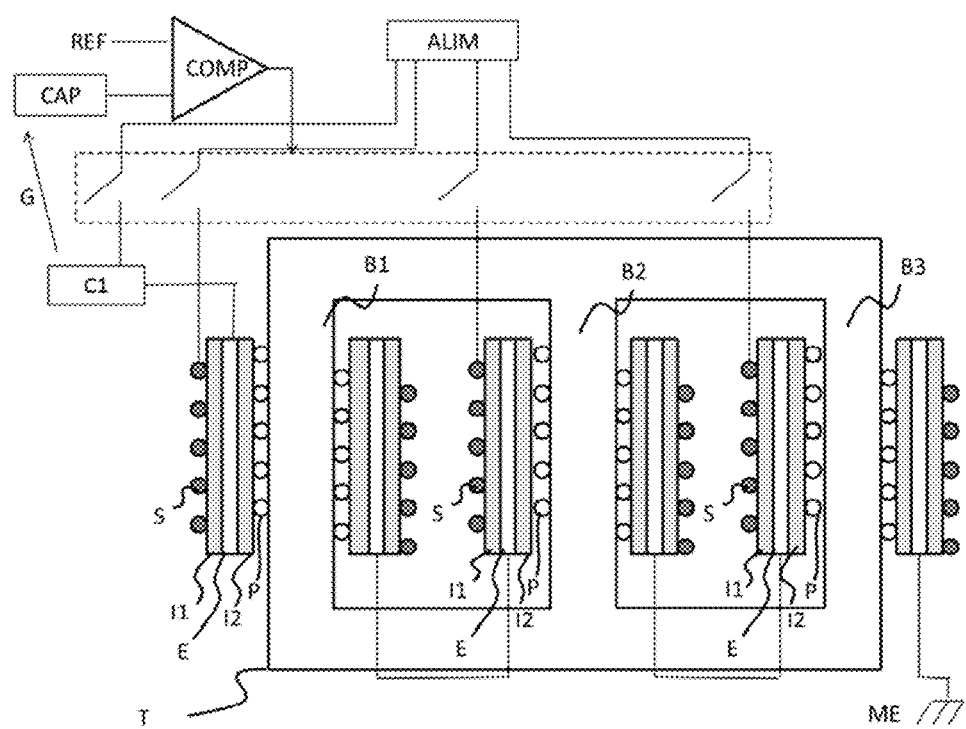
FIG. 3, electrical equipment according to a third embodiment of the invention.

It is possible to link the metal screens E together in series, as is illustrated in FIG. 3. FIG. 3 presents electrical equipment according to a third embodiment of the invention. In this embodiment, the electrical equipment is a transformer T comprising three coils (B1, B2, B3). The coils B1, B2, B3 each comprise, between a primary winding P and a secondary winding S, a metal screen E surrounded by two thermal insulations I1 and I2. The screens E are linked to one another in series. At least one of the screens is linked to an electrical ground ME, and the first load C1 is at least linked to a screen E. As previously, the transformer T is supplied with energy by an electrical power supply system ALIM and a sensor CAP makes it possible to measure a quantity G characteristic of the first load C1. A comparator COMP receives these measurements of G and compares them to one another or to a reference quantity REF. The reference REF can be a value or a range of values. As in FIG. 2, this comparison makes it possible to detect a loss of link between the electrical ground ME and the screens E.

Figure 4A:
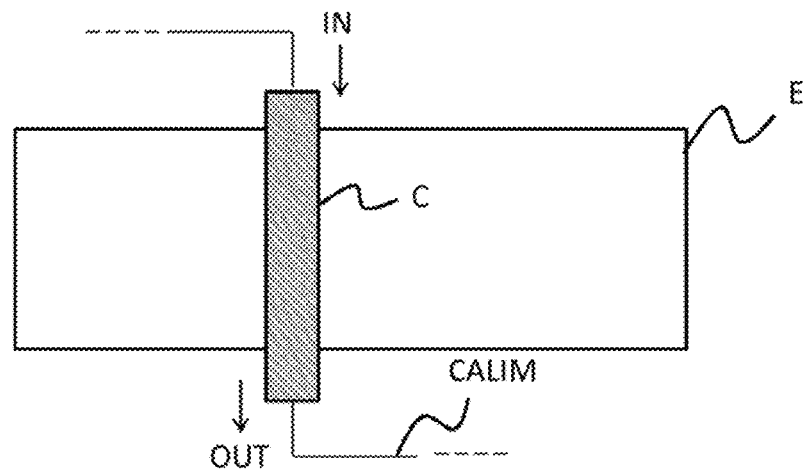
FIGS. 4a and 4b, electrical equipment according, respectively, to a fourth embodiment and a fifth embodiment of the invention.
Figure 4B:
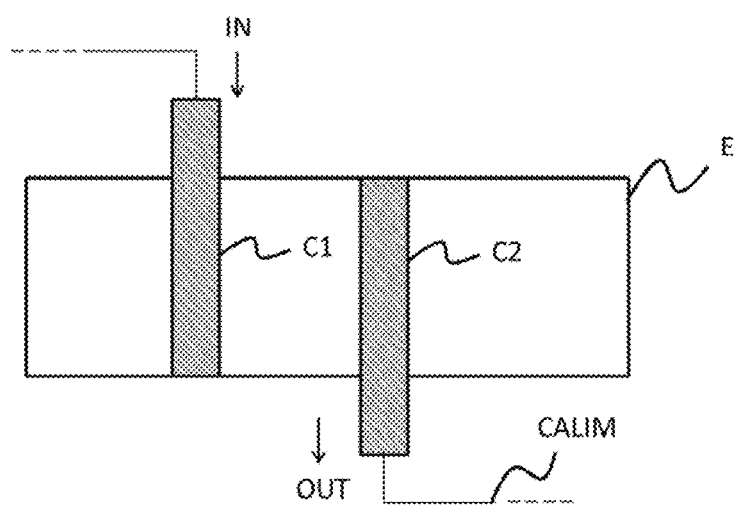

The series-connection of the screens E makes it possible notably to be able to detect a loss of link between the power supply conductor, such as the electrical ground ME, and a screen E, but also to detect a loss of link between two screens E, if the connection between the screen E and the power supply conductor is chosen appropriately (FIGS. 4a and 4b).

FIGS. 4a and 4b respectively present a view of the screen E according to a fourth embodiment and a fifth embodiment, and more particularly the type of connection linking a screen E to the power supply conductor CALIM.

FIG. 4a notably presents a view of the screen E unfolded with a "through" connection C to the conductor CALIM. Therefore if a connection fault between the screen E and the conductor CALIM appears, the current will nevertheless be able to circulate between the input IN and the output OUT of the connection C, therefore it will not be possible to detect the loss of link between the screen E and the conductor CALIM and therefore, if an insulation fault occurs, it will also be undetectable.

FIG. 4b presents a view of the screen E unfolded with distinct connections C1 for the input IN and C2 for the output OUT of the power supply conductor CALIM. The two connections C1 and C2 can be placed alongside one another or 180° opposite when the screen E is wound around the coil. It is also possible to have the input IN and the output OUT opposite, as is the case in FIG. 4b, or on the same side. If one of the connections C1 or C2 has a connection fault with the screen E, the current cannot circulate between the input IN and the output OUT of the conductor CALIM and it will therefore be possible to detect the connection fault, unlike with a "through" connection.

According to several embodiments of the invention, the first load C1 can be a fan, or an electronic circuit board or a contactor.

Figure 5:
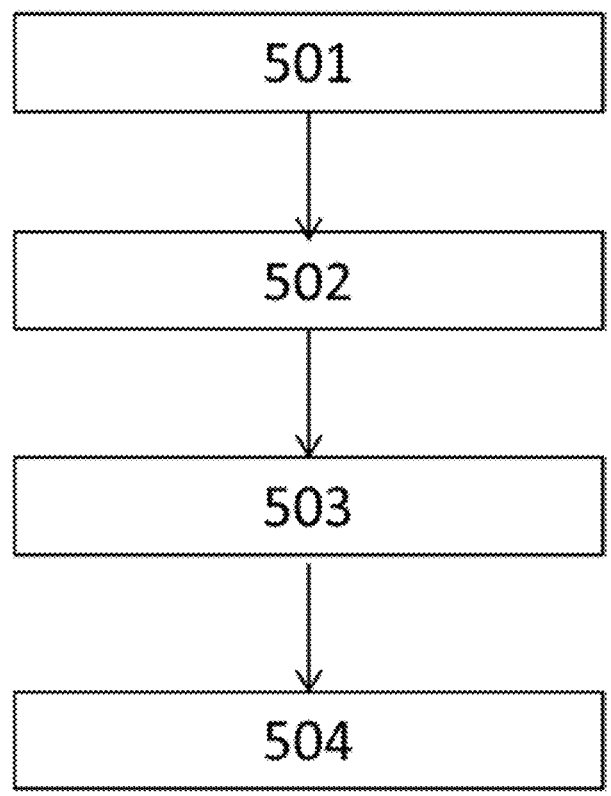
FIG. 5, a method for detecting and transmitting a dormant failure according to an embodiment of the invention.

FIG. 5 presents a method for detecting and transmitting a dormant fault of electrical equipment according to an embodiment of the invention. This method applies to electrical equipment such as those described previously, powered by a power supply system. The first step 501 consists in defining a range of values or a reference value of a quantity characteristic of the first load. This range of values or this reference guarantee the good operation of the equipment. The second step 502 consists in measuring the quantity characteristic of the first load with the sensor of the equipment. These measurements are then transmitted to a comparator (step 503) which compares the measurements to the range of values or to the reference value. If the measurements lie within the defined range of values, no fault or failure is detected and the equipment continues to be powered, whereas, if the measurements do not lie within the defined range of values (step 504), then the electrical power supply to the equipment is cut.

According to several embodiments, the measured quantity characteristic of the first load can be:
- a speed, for example if the first load is a fan, that can be the speed of rotation of the fan; or
- a temperature, it is for example possible to measure a temperature of an electronic circuit board, of a diode, of a transformer; or
- an electrical current; or
- an electrical voltage.

Indeed, whatever the nature of the first load, it is possible to measure the current passing through that load, the voltage at the terminals of that load, or the temperature of that load. In the case of a transformer comprising a metal screen between the different primary and secondary windings, the dormant failure can for example be the loss of link between the electrical ground and the screen. If the first load is a fan, in case of loss of link, the fan will stop turning, therefore the measurement of its speed of rotation will indeed make it possible to detect this dormant failure. If the first load is an electronic circuit board, in case of loss of link, the temperature of the board will increase and either this rise in temperature will be detected or the information concerning this temperature will not be received. Whether or not the temperature information is received, that will not be the reference value or the reference range REF, therefore the loss of link will be detected. If a current is measured, in case of loss of link, the current will drop and, as previously, either the current drop will be detected, or the information concerning the current values of the first load will not be received, therefore the loss of link will also be detected.

The invention claimed is:

1. An electrical equipment comprising:
a transformer;
a first load configured for a nominal use of the equipment;
a sensor configured to measure a quantity characteristic of the first load; and
a power supply conductor,
wherein the transformer comprises a primary winding, at least one secondary winding and at least one first metal screen placed between the primary winding and the at least one secondary winding, the first load and the at least first metal screen are linked electrically to the power supply conductor, and wherein the equipment also comprises a comparator configured to compare measurements from the sensor to detect a dormant failure of the at least first metal screen.

2. The electrical equipment according to claim 1, wherein the comparator and the sensor are configured to detect a loss of link between the power supply conductor and the at least first metal screen.

3. The electrical equipment according to claim 1, wherein the first load is chosen from among a fan, a contactor and an electronic circuit board.

4. The electrical equipment according to claim 1, comprising a second metal screen linked in series or in parallel to the at least first metal screen by the power supply conductor.

5. The electrical equipment according to claim 4, wherein the second metal screen is linked in series to the at least first metal screen and the comparator and the sensor are configured to detect a loss of link between the second metal screen and the at least first metal screen.

6. A method for detecting the dormant failure and ensuring the safety of equipment according to claim 1, linked to an electrical power supply system, comprising the following steps:
a) defining a range of values of a quantity characteristic of the first load guaranteeing the good operation of the equipment;
b) measuring, with the sensor, the quantity characteristic of the first load;
c) comparing with the comparator the quantities measured in the step b) with the range of values defined in the step a); and
d) cutting the link to the electrical power supply system from the equipment if the quantity measured in the step b) is outside of the range defined in the step a).

7. The detection method according to claim 6, wherein the quantity measured in the step b) is chosen from among a speed, an electrical current, a voltage or a temperature.

* * * * *